United States Patent
Kanatake

(10) Patent No.: US 6,202,423 B1
(45) Date of Patent: Mar. 20, 2001

(54) NON-DAMAGE TRANSPORT SYSTEM BY ICE CONDENSATION

(75) Inventor: Takashi Kanatake, Dallas, TX (US)

(73) Assignee: Bell Semiconductor, Inc., Allen, TX (US)

( * ) Notice: Subject to any disclaimer, the term of this patent is extended or adjusted under 35 U.S.C. 154(b) by 0 days.

(21) Appl. No.: 09/474,947

(22) Filed: Dec. 30, 1999

(51) Int. Cl.⁷ .................................................. F25D 3/00
(52) U.S. Cl. ............................. 62/63; 62/64; 62/259.2; 62/373
(58) Field of Search ........................... 62/63, 64, 373, 62/374, 259.2, 62

(56) References Cited

U.S. PATENT DOCUMENTS

| | | | |
|---|---|---|---|
| 2,819,594 | * 1/1958 | Lorie | 62/373 |
| 2,876,109 | * 3/1959 | Hemery et al. | 62/64 |
| 2,879,005 | * 3/1959 | Jarvis | 62/64 |
| 3,458,324 | * 7/1969 | Kramer | 62/62 |
| 4,548,045 | * 10/1985 | Altares et al. | 62/64 |
| 4,869,090 | * 9/1989 | Tada et al. | 62/62 |
| 5,216,890 | * 6/1993 | Ban et al. | 62/63 |
| 5,955,776 | 9/1999 | Ishikawa | 257/618 |

\* cited by examiner

*Primary Examiner*—William E. Tapolcai
(74) *Attorney, Agent, or Firm*—Haynes and Boone, LLP

(57) ABSTRACT

A method and system for transporting objects without causing harmful physical contact is disclosed. The method and system can be used in a manufacturing process for fabricating spherical shaped semiconductor devices. The method cools the spherical shaped device and applies moisture such as de-ionized water. The moisture forms a coat of ice on an outer surface of the cooled spherical shaped device. The spherical shaped device with the coat of ice can then be easily transported, the ice preventing any harmful physical contact to the device. Once the spherical shaped device with the coat of ice has been transported, the device is heated to remove the coat of ice therefrom

14 Claims, 2 Drawing Sheets

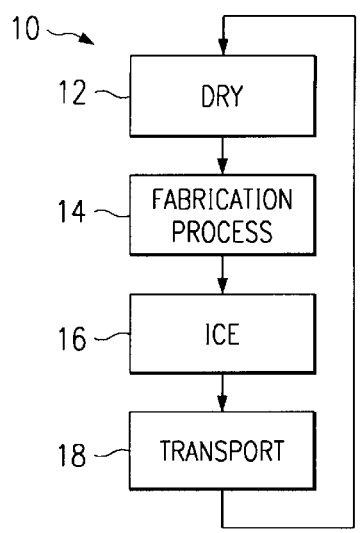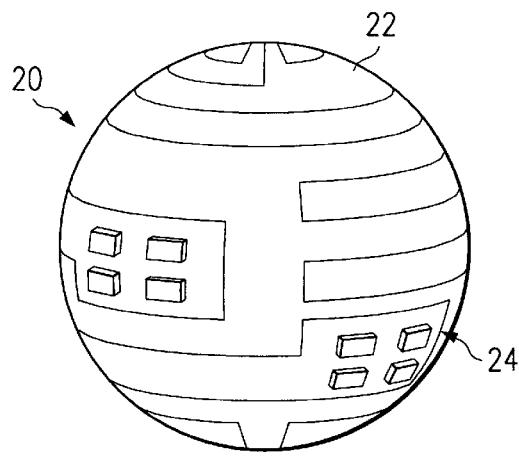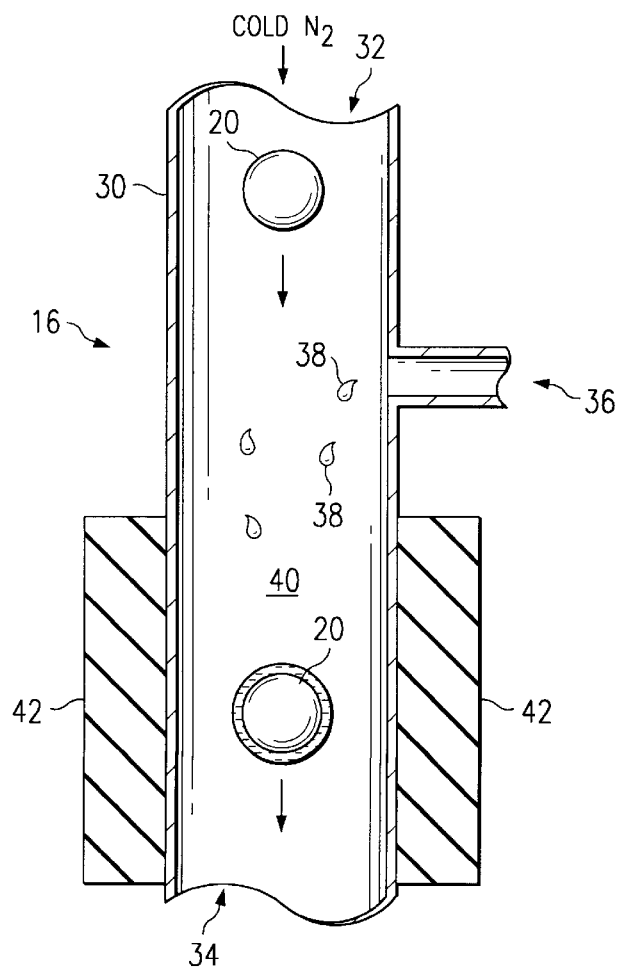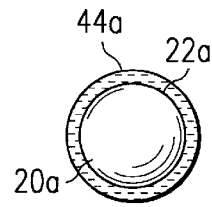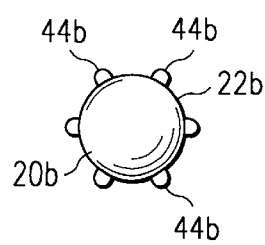

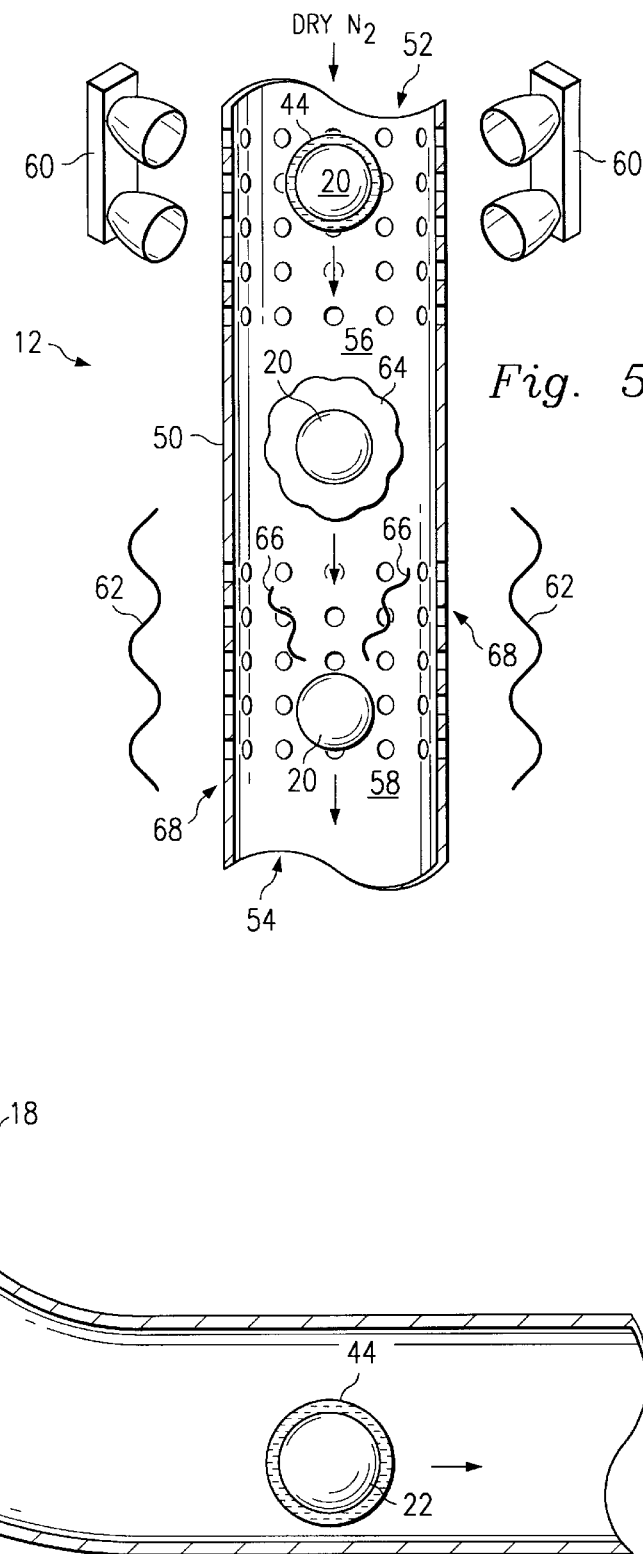
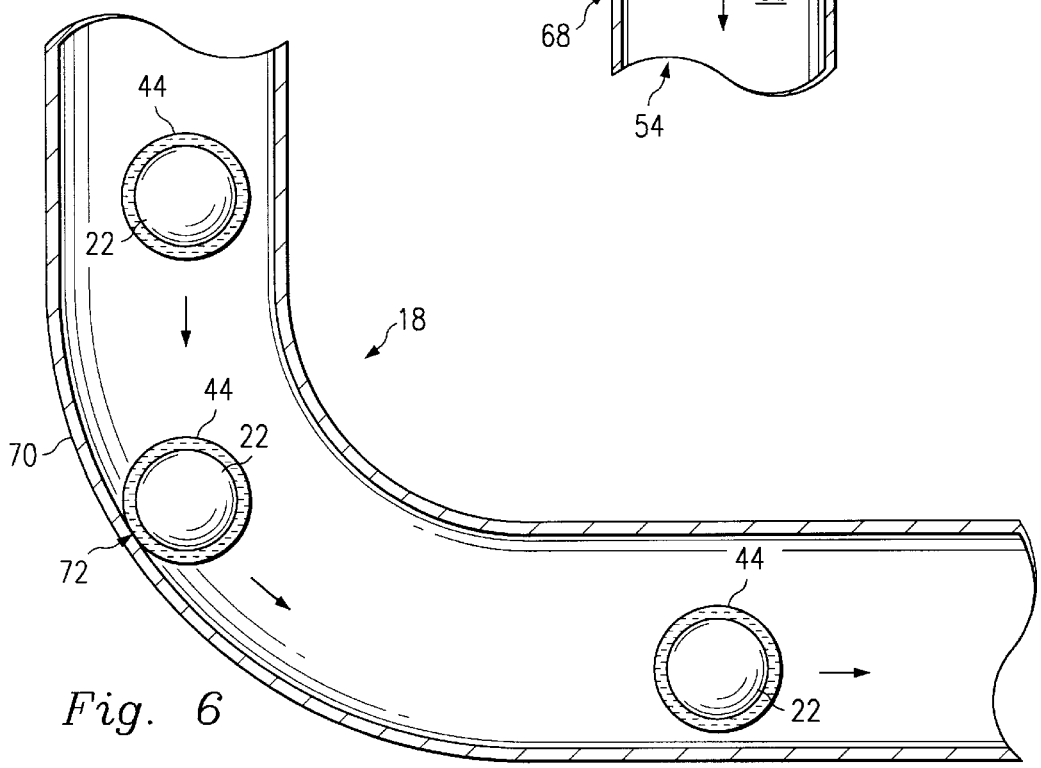

NON-DAMAGE TRANSPORT SYSTEM BY ICE CONDENSATION

BACKGROUND OF THE INVENTION

The invention relates generally to device transportation systems, and in one embodiment, to a method and system for forming ice on spherical-shaped objects for use in the manufacture and transport of spherical-shaped semiconductor integrated circuits.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, because the wafers are round and the completed chips are rectangular, the peripheral portion of each wafer cannot be used.

Therefore, due to these and various other problems, only a few companies in the world today can successfully manufacture conventional flat chips. Furthermore, the chips must bear a high price to cover the costs of manufacturing, as well as the return on initial capital and investment.

In U.S. Pat. No. 5,955,776, assigned to the same assignee as the present application and hereby incorporated by reference as if reproduced in its entirety, a method and system for manufacturing spherical-shaped semiconductor integrated circuits is disclosed. A manufacturing process disclosed in the aforementioned patent utilizes "tubes" to not only process the spherical-shaped semiconductor integrated circuits, but to transport them from process to process. By using tubes in this manner, a true pipeline production system is obtained, and conventional clean room requirements are significantly reduced.

Complicating the manufacturing process for spherical-shaped semiconductor integrated circuits are the special handling requirements which must be afforded the circuits during their manufacture. Unlike conventional integrated circuits formed on only one surface of a semiconductor wafer, the spherical-shaped semiconductor integrated circuit produced from a spherical-shaped substrate may consume the entire surface area of the substrate. Therefore, the spherical-shaped semiconductor integrated circuits cannot be placed on a conventional wafer chuck or carried in a conventional wafer boat. If this were done, at least a portion of the substrate's surface, and any integrated circuit produced thereon, would receive harmful physical contact. Furthermore, even tube processing and transporting, such as is disclosed in presently incorporated U.S. Pat. No. 5,955,776, may cause harmful physical contact. It is understood that although a moderate amount of contact may not be harmful, contact caused by bumping around a processing or transport tube can cause severe damage to the spherical-shaped semiconductor integrated circuits.

Thus, there remains a need for a system and method capable of readily transporting spherical-shaped objects without causing harmful physical contact.

SUMMARY OF THE INVENTION

The present invention provides a method and system for transporting objects without causing harmful physical contact. The method and system can be used, for example, in a manufacturing process for fabricating spherical shaped semiconductor devices. In one embodiment, the method cools the spherical shaped device and applies moisture such as de-ionized water. The moisture forms a coat of ice on an outer surface of the cooled spherical shaped device. The spherical shaped device with the coat of ice can then be easily transported, the ice preventing any harmful physical contact to the device. Once the spherical shaped device with the coat of ice has been transported, the device is heated to remove the coat of ice therefrom.

In some embodiments, one or more of the steps are performed in tubes. In fact, a continuous tube can be used for a significant portion of the entire manufacturing process.

Referring now to the system, in one embodiment the system includes a cooler for cooling the spherical shaped device and a moisture applicator for providing moisture to an outer surface of the cooled spherical shaped device. The moisture can thereby adhere to the spherical shaped device to form a coat of ice thereon. The system also includes transporting means, such as a tube, for transporting the spherical shaped device with the coat of ice on the outer surface. The system may also include a heater for heating the semiconductor device with the coat of ice after it has been transported. The heating serves to convert the coat of ice to a moisture gas. In some embodiments, the system includes a condensing system for drawing the moisture gas from the semiconductor device.

In some embodiments, the cooler is a fluid, such as nitrogen. The nitrogen fluid may also facilitate movement of the semiconductor device.

BRIEF DESCRIPTION OF THE DRAWINGS

FIG. 1 is a flowchart of a manufacturing process for implementing one embodiment of the present invention.

FIG. 2 is an illustration of a spherical shaped semiconductor integrated circuit device being manufactured by the process of FIG. 1.

FIG. 3 is one embodiment of an ice process of the manufacturing system of FIG. 1.

FIGS. 4a and 4b are cross sectional views of the spherical shaped semiconductor integrated circuit device of FIG. 2 after going through the ice process of FIG. 3.

FIG. 5 is one embodiment of a dry process of the manufacturing system of FIG. 1.

FIG. 6 is one embodiment of a transportation process of the manufacturing system of FIG. 1.

DESCRIPTION OF THE EMBODIMENTS

Referring to FIG. 1, the reference numeral 10 refers, in general, to a manufacturing process for fabricating spherical shaped semiconductor integrated circuit devices. It is understood that the present disclosure provides many different embodiments, or examples, for implementing different features on substantially spherical devices. Techniques and requirements that are only specific to certain embodiments or certain shaped devices should not be imported into other embodiments or devices. Also, specific examples of processes, components, and devices are described below to simplify the present disclosure. These are, of course, merely examples and are not intended to limit the invention from that described in the claims.

The manufacturing process 10 includes a drying process 12, a fabrication process 14, an ice process 16, and a transport process 18. It is understood that the processes 12–18 are merely representative of many similar processes. For example, the fabrication process 14 may include conventional processes such as chemical vapor deposition, but may include other process that are not traditionally called fabrication processes, such as painting or the formation of solder bumps on the spherical shaped integrated circuit devices.

The manufacturing process 10 is illustrated as a loop, sequential and repeatedly performing steps 12, 14, 16, and 18. However, the actual process for manufacturing spherical shaped integrated circuit devices may not be so repetitive. For example, certain fabrication processes 14 may be done in succession without the intervening steps of icing 16, transporting 18, and drying 12.

Referring now to FIG. 2, the reference numeral 20 refers, in general, to a spherical shaped semiconductor integrated circuit device (hereinafter "sphere"). The sphere 20 is one that may, for example, be produced according to presently incorporated U.S. Pat. No. 5,955,776. On an outer surface 22 of the sphere 20 are a plurality of circuit components 24. The present invention may be used for processing the circuit components 24 onto the sphere 20, so in some instances there may be no actual circuit components, while in other instances there may be circuit components covering a large portion of the outer surface 22.

Referring now to FIG. 3, one example of the ice process 16 is illustrated. In the present example, the ice process is performed in a tube 30. The tube 30 includes an inlet opening 32 and an outlet opening 34 so that the sphere 20 may travel from the inlet to the outlet without physically contacting the tube. In the present embodiment, the sphere 20 is dropping by gravity through the tube 30, but other embodiments may utilize different methods to prevent contact. Also, it is understood that slight, incidental contact may not be damaging to the sphere 20, and that further discussion of contact refers only to touching that physically damages the sphere.

The tube 30 also includes a moisture inlet opening 36 for receiving a moisture mist 38. In the present example, the moisture mist 38 is a de-ionized water solution, although other solutions may also be used. The moisture mist 38 is injected into the tube 30 to define a reaction zone 40 inside the tube. The reaction zone 40 is where the moisture mist 38 interacts with the sphere 20. In the present example, the tube 30 includes an insulator 42 at the reaction zone for reasons discussed below.

In operation, the sphere 20 enters the tube 30 relatively cold. For example, very cold nitrogen ($N_2$) may be dispersed with the sphere 20. The $N_2$ not only reduces the temperature of the sphere 20, but also removes other processing gases and facilitates the movement of the sphere inside the tube 30. Furthermore, the $N_2$ may be a remnant material from a previous fabrication process (e.g., the process 14). Although the $N_2$ is illustrated as entering the process tube at the inlet 32, other embodiments may have a separate inlet for the $N_2$.

The sphere 20 moves through the inlet 32 and towards the reaction zone 40 inside the tube 30. As the relatively cold sphere 20 so moves, it contacts the moisture mist 38. The moisture mist 38 attaches to the cold sphere 20, and eventually forms a protective coat of ice 44 around the sphere. The insulator 42 prevents any substantial amounts of ice forming on the tube 30, especially at the reaction zone 40. The sphere 20 with the protective coat of ice 44 then moves through the outlet 34 of the tube 30.

Referring also to FIGS. 4a and 4b, depending on the wettability of the sphere 20, different ice coatings 44 may be produced. FIG. 4a illustrates a more wettable embodiment of the sphere, designated sphere 20a. The sphere 20a receives the ice coating, designated ice coating 44a, that covers the entire outer surface 22a of the sphere. FIG. 4b illustrates a less wettable embodiment of the sphere, designated sphere 20b. The sphere 20b receives the ice coating, designated ice coating 44b, that "beads" to only cover portions of the outer surface 22b of the sphere. Either of these embodiments work well for implementing the features of the present embodiment, but for the sake of simplicity and clarity, only the embodiments of FIG. 4a will be further illustrated.

Referring now to FIG. 5, one example of the dry process 12 is illustrated. In the present example, the dry process is performed in a tube 50 made of a heat-conductive material. The tube 50 includes an inlet opening 52 and an outlet opening 54 so that the sphere 20 may travel from the inlet to the outlet without physically contacting the tube. In the present embodiment, the sphere 20 is dropping by gravity through the tube 50, but other embodiments may utilize different methods to prevent contact.

The tube 50 includes a heater zone 56 and a condensation zone 58. The heater zone 56 is heated by one or more heaters 60. For the sake of example, the heaters 60 are infrared heaters, although many different types of heaters may be used. Likewise, the condensation zone 58 is cooled by one or more coolers 62. For the sake of example, the coolers 62 may be a liquid nitrogen cooling system, although many different types of coolers.

As mentioned above, the tube 50 is made of a heat-conductive material. The heat-conductive material facilitates the heaters 60 and coolers 62. Alternate embodiments may not require such material. For example, the heaters 60 and coolers 62 may be placed inside the tube 50.

In operation, the relatively cold sphere 20 enters the tube 50 with the ice coating 44 attached. In addition, very dry $N_2$ may be dispersed with the sphere 20. The $N_2$ not only maintains the cool temperature of the sphere 20, but also keeps the atmosphere in the tube 50 very dry and facilitates the movement of the sphere inside the tube. Furthermore, the $N_2$ may be a remnant material from the previous ice process 16. Although the N₂ is illustrated as entering the process tube at the inlet 52, other embodiments may have a separate inlet for the N₂.

The sphere 20 (with the ice coat 44) moves through the inlet 52 and towards the heating zone 56 inside the tube 50. As the relatively cool sphere 20 so moves, the ice coat 44 begins to melt and evaporate, as illustrated by a condensation cloud 64. The sphere 20 and condensation cloud 64 then move towards the cooling zone 58. The cooling zone 58 works as a cold trap for condensation, drawing the condensation (now designated with reference numeral 66) away from the sphere 20. The condensation 66 moves towards the tube 50 and may exit the tube at one or more condensation outlets 68. The sphere 20 then exits the outlet 54 completely dry and free from any ice coat or other moisture.

Referring now to FIG. 6, one example of the transport process 16 is illustrated. In the present example, the transport process is performed in a tube 70. The transport tube 70 may connect to the icing tube 30 and/or the drying tube 50, or other types of tubes, as required. Furthermore, the transport tube 70, the icing tube 30, and the drying tube 50 may be one single tube.

In the present example, the transport tube 70 is curved. Accordingly, when the sphere 20 moves through the transport tube 70, it may contact the tube at one or more points (e.g., a contact point 72). However, because the sphere 20 includes the ice coat 44, the contact is not harmful to the sphere 20. Therefore, the sphere 20 is safely and efficiently transported.

Thus, there has been described and illustrated herein, a method and apparatus for transporting spherical-shaped objects spherical-shaped objects. It should be clearly understood, however, that various modifications, changes and substitutions are intended in the foregoing disclosure and in some instances some features of the invention will be employed without a corresponding use of other features. For example, different shaped objects can also benefit from the present invention. Accordingly, it is appropriate that the appended claims be construed broadly and in a manner consistent with the scope of the invention.

What is claimed is:

1. A method for transporting a substantially spherical shaped device, the method comprising the steps of:

cooling the spherical shaped device;

applying moisture to form a coat of ice on an outer surface of the cooled spherical shaped device; and transporting the spherical shaped device with the coat of ice on the outer surface.

2. The method of claim 1 wherein the step of transporting utilizes a tube.

3. The method of claim 1 wherein the moisture is de-ionized water.

4. The method of claim 1 further comprising the step of:

heating the spherical shaped device with the coat of ice after the step of transporting, to thereby removed the coat of ice from the device.

5. The method of claim 1 wherein the spherical shaped device is a semiconductor that is in a process of having an integrated circuit fabricated thereon.

6. A system for transporting a semiconductor device, the system comprising:

a cooler for cooling the spherical shaped device;

a moisture applicator for providing moisture to an outer surface of the cooled spherical shaped device to form a coat of ice thereon; and means for transporting the spherical shaped device with the coat of ice on the outer surface.

7. The system of claim 6 wherein the transporting means is a tube.

8. The system of claim 6 wherein the cooler is a fluid.

9. The system of claim 8 wherein the fluid also facilitates movement of the semiconductor device.

10. The system of claim 6 further comprising:

a heater for heating the semiconductor device with the coat of ice after transporting to convert the coat of ice to a moisture gas.

11. The system of claim 10 further comprising:

a condensing system for drawing the moisture gas from the semiconductor device.

12. The system of claim 11 further comprising:

a perforated tube for receiving and removing the drawn moisture gas.

13. A tube system for transporting a spherical shaped semiconductor device, the system comprising:

a first tube including a cooler for cooling the spherical shaped semiconductor device and a moisture applicator for providing moisture to an outer surface of the cooled spherical shaped semiconductor device to form a coat of ice thereon;

a second tube for transporting the spherical shaped device with the coat of ice on the outer surface; and a third tube including a heater for heating the semiconductor device with the coat of ice after being transported, to convert the coat of ice to a moisture gas, and a condensing system for drawing the moisture gas from the semiconductor device.

14. The system of claim 13 wherein the first, second, and third tubes are portions of a single, continuous tube.

\* \* \* \* \*

UNITED STATES PATENT AND TRADEMARK OFFICE
CERTIFICATE OF CORRECTION

PATENT NO. : 6,202,423 B1
DATED : March 20, 2001
INVENTOR(S) : Takashi Kanatake

It is certified that error appears in the above-identified patent and that said Letters Patent is hereby corrected as shown below:

Title page,
The Assignee should be listed as Ball Semiconductor, Inc.

Signed and Sealed this

Twenty-eighth Day of August, 2001

Attest:

*Attesting Officer*

NICHOLAS P. GODICI
*Acting Director of the United States Patent and Trademark Office*